United States Patent
Jung et al.

(10) Patent No.: US 10,901,276 B2
(45) Date of Patent: Jan. 26, 2021

(54) DISPLAY DEVICE

(71) Applicant: Samsung Display Co. Ltd., Yongin-si (KR)

(72) Inventors: Min Su Jung, Hwaseong-si (KR); Han Bum Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 39 days.

(21) Appl. No.: 16/294,928

(22) Filed: Mar. 7, 2019

(65) Prior Publication Data

US 2019/0384088 A1 Dec. 19, 2019

(30) Foreign Application Priority Data

Jun. 18, 2018 (KR) .......................... 10-2018-0069458

(51) Int. Cl.
| | | |
|---|---|---|
| *H05K 1/00* | (2006.01) | |
| *G02F 1/1345* | (2006.01) | |
| *H05K 1/18* | (2006.01) | |
| *G02F 1/1362* | (2006.01) | |

(52) U.S. Cl.
CPC ...... *G02F 1/13452* (2013.01); *G02F 1/13458* (2013.01); *G02F 1/136286* (2013.01); *H05K 1/189* (2013.01); *H05K 2201/10136* (2013.01)

(58) Field of Classification Search
CPC ............. G02F 1/13452; G02F 1/13458; G02F 1/136286; H05K 1/189; H05K 2201/10136

See application file for complete search history.

(56) References Cited

U.S. PATENT DOCUMENTS

| | | | | |
|---|---|---|---|---|
| 2012/0098774 A1* | 4/2012 | Abe | .................... | G02F 1/13338 |
| | | | | 345/173 |
| 2013/0342779 A1* | 12/2013 | Jung | ................. | G02F 1/136227 |
| | | | | 349/43 |
| 2014/0085585 A1* | 3/2014 | Sung | .................... | G02F 1/13458 |
| | | | | 349/143 |
| 2016/0300548 A1* | 10/2016 | Seo | ....... | G02F 1/13452 |
| 2017/0257953 A1* | 9/2017 | Lee | ....... | G02F 1/13452 |
| 2017/0358602 A1* | 12/2017 | Bae | ......... | H01L 24/08 |
| 2018/0110122 A1* | 4/2018 | Lee | ......... | H05K 1/113 |
| 2018/0188432 A1* | 7/2018 | Choi | ................... | H01L 27/3225 |

FOREIGN PATENT DOCUMENTS

| | | |
|---|---|---|
| KR | 10-2009-0090762 | 8/2009 |
| KR | 10-2014-0038823 | 3/2014 |
| KR | 10-2014-0136233 | 11/2014 |
| KR | 10-2016-0033817 | 3/2016 |

* cited by examiner

*Primary Examiner* — Yuriy Semenenko
(74) *Attorney, Agent, or Firm* — H.C. Park & Associates, PLC

(57) ABSTRACT

A display device includes a display substrate comprising a plurality of pixels electrically connected to select lines and data lines; first connection pads disposed on an upper surface of the display substrate and electrically connected to the pixels; and second connection pads disposed on a surface of the display substrate that is different from the upper surface and electrically connected to the pixels, wherein the second connection pads are electrically separated from the first connection pads. This allows the area of a surface of a display substrate that can be occupied by a flexible printed circuit board attached thereto to be increased. As a result, the risk of an open-circuit of the wiring can be reduced, and the operational reliability of the device can be improved.

18 Claims, 11 Drawing Sheets

DISPLAY DEVICE

CROSS REFERENCE TO RELATED APPLICATION

This application claims priority from and the benefit of Korean Patent Application No. 10-2018-0069458, filed on Jun. 18, 2018, which is incorporated by reference for all purposes as if fully set forth herein.

BACKGROUND

Field

Exemplary embodiments/implementations of the invention relate generally to a display device and, more specifically, to the present disclosure relates to a display device including connection pads for connecting flexible printed circuit boards on its upper surface and another surface.

Discussion of the Background

Display devices become more and more important as multimedia technology evolves. Accordingly, a variety of display devices such as liquid-crystal display (LCD) devices and organic light-emitting diode display (OLED) devices are currently being developed.

As the resolution of the display device increases, more and more pixels are required in a panel having a limited area. The number of wirings for driving such pixels also increases. As a result, the width of the wirings becomes narrower. If the number of such narrow wirings is increased, the operation reliability of the display device may be affected even by minute impacts or defects. Therefore, what is required is research for improving reliability.

The above information disclosed in this Background section is only for understanding of the background of the inventive concepts, and, therefore, it may contain information that does not constitute prior art.

SUMMARY

Devices constructed according to exemplary embodiments of the invention provide a display device with improved operational reliability.

Additional features of the inventive concepts will be set forth in the description which follows, and in part will be apparent from the description, or may be learned by practice of the inventive concepts.

An embodiment of a display device includes a display substrate comprising a plurality of pixels electrically connected to select lines and data lines; first connection pads disposed on an upper surface of the display substrate and electrically connected to the pixels; and second connection pads disposed on a surface of the display substrate that is different from the upper surface and electrically connected to the pixels, wherein the second connection pads are electrically separated from the first connection pads.

An embodiment of a display device includes a display substrate comprising: a plurality of pixels electrically connected to select lines and data lines, wherein first connection pads receiving a first signal for driving the pixels are disposed on a upper surface of the display substrate, and second connection pads receiving a second signal for driving the pixels area disposed on a surface of the display substrate different from the upper surface; a first flexible printed circuit board electrically connected to the first connection pads; and a second flexible printed circuit board electrically connected to the second connection pads, wherein the second flexible printed circuit board is different from the first flexible printed circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
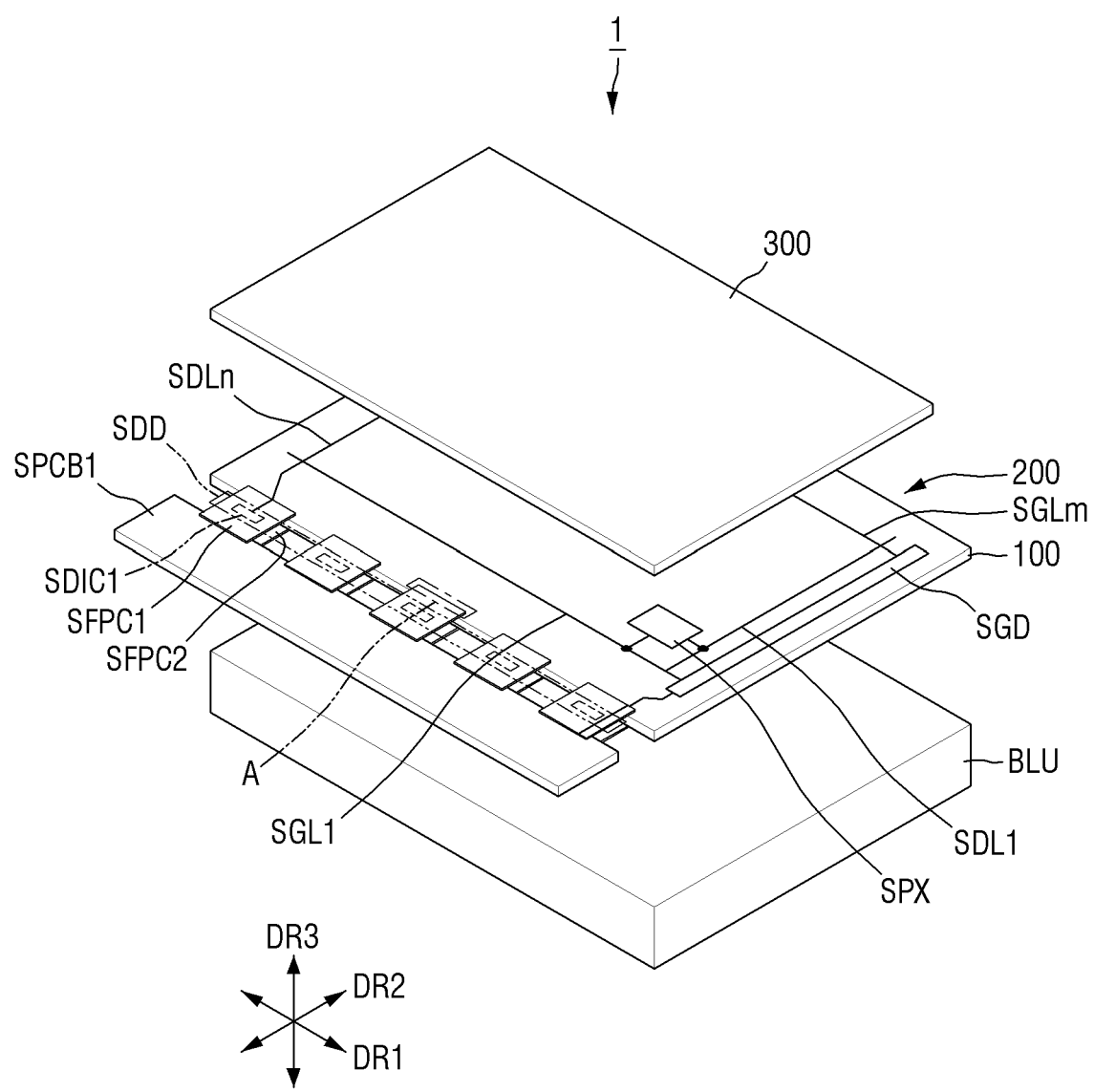
FIG. 1 is an exploded, perspective view of a display device according to some exemplary embodiments of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the following description, a display device refers to a device for providing light, such as a liquid-crystal display device, an organic light-emitting display device, an inorganic light-emitting display device, a plasma display device, etc. for displaying images on a screen using a lighting device or light.

FIG. 1 is an exploded, perspective view of a display device according to some exemplary embodiments of the present disclosure.

In the following description, the inventive concepts will be described with an example in which the display device is a liquid-crystal display device including a liquid crystal layer. It is, however, to be understood that the present disclosure is not limited thereto. For example, a display device other than a liquid-crystal display device (for example, an organic light-emitting display device) may be employed, in which case some elements to be described below may be eliminated, or other elements may be added.

The display device according to exemplary embodiments of the present disclosure may be used in a large electronic device such as a television and an electric board, as well as in a small and medium electronic device such as a personal computer, a laptop computer, a vehicle navigation device and a camera, etc. In addition, the display device may be used in a tablet PC, a smart phone, a personal digital assistant (PDA), a portable multimedia player (PMP), a game device, a wristwatch type electronic device, etc. It is to be noted that the above-listed applications are merely examples, and the display device according to exemplary embodiments of the present disclosure may be employed in many other electronic devices.

Referring to FIG. 1, the display device 1 may include a first display substrate 100, a liquid-crystal layer 200, and a second display substrate 300. In some exemplary embodiments, the display device 1 may further include a first flexible printed circuit board SFPC1, a second flexible printed circuit board SFPC2, a driving printed circuit board SPCB1, and a backlight unit BLU.

The first display substrate 100, the second display substrate 300 and the backlight unit BLU may have a rectangular shape that has longer sides in a first direction DR1 and shorter sides in a second direction DR2 perpendicular to the disposed direction DR1. It is, however, to be understood that the shapes of the first display substrate 100, the second display substrate 300 and the backlight unit BLU are not limited thereto. Some portion of the first display substrate 100, the second display substrate 300 and the backlight unit BLU may have curved portions as desired.

The backlight unit BLU may generate light and may provide the generated light to the first display substrate 100, the liquid-crystal layer 200, and the second display substrate 300. The display panel including the first display substrate 100, the liquid-crystal layer 200 and the second display substrate 300 may generate an image using the light provided from the backlight unit BLU, and may provide it to the outside.

Although not shown in the drawings, a display area in which an image is displayed and a non-display area in which no image is displayed may be defined in the display panel. The non-display area may surround the display area. Although not shown in the drawings, the display device 1 may further include a window member on the second display substrate 300, which covers the display panel and transmits an image to the outside.

The backlight unit BLU may be, for example, an edge-lit backlight unit or a direct-lit backlight unit, but the exemplary embodiments of the present disclosure are not limited thereto.

The first display substrate 100 may include a plurality of pixels SPX. The plurality of pixels SPX may be defined by, for example, a plurality of gate lines SGL1 to SGLm, and a plurality of data lines SDL1 to SDLn, where m and n are natural numbers. Specifically, each of the pixels SPX may be defined at the respective intersections of the gate lines SGL1 to SGLm and the data lines SDL1 to SDLn.

It is, however, to be understood that the exemplary embodiments of the present disclosure are not limited thereto. The plurality of pixels SPX may be electrically connected to the plurality of gate lines SGL1 to SGLm and the plurality of data lines SDL1 to SDLn, and may be formed at positions other than the intersections of the plurality of gate lines SGL1 to SGLm and the plurality of data lines SDL1 to SDLn. In some exemplary embodiments, the plurality of gate lines SGL1 to SGLm may be select lines for selecting a plurality of pixels SPX.

Although only one pixel SPX is depicted in FIG. 1 for convenience of illustration, it is to be understood that a plurality of pixels SPX may be defined on the first display substrate 100 in practice. In each of the pixels SPX, a pixel electrode defining the pixel may be disposed.

The gate lines SGL1 to SGLm and the data lines SDL1 to SDLn may be insulated from one another and intersect with one another. The gate lines SGL1 to SGLm may be extended in the first direction DR1 and may be electrically connected to a gate driver SGD. The data lines SDL1 to SDLn may be extended in the second direction DR2 and may be connected to a data driver SDD.

The pixels SPX may be electrically connected to the gate lines SGL1 to SGLm and the data lines SDL1 to SDLn intersecting with each other. The pixels SPX may be arranged, but is not limited to being, in a matrix.

The gate driver SGD may be disposed at a predetermined location adjacent to at least one of the shorter sides of the first display substrate 100, for example. It is, however, to be understood that the location of the gate driver SGD is not limited thereto.

For example, the gate driver SGD may be formed during a process of fabricating transistors for driving the pixels SPX and may be mounted on the first display substrate 100 in the form of an amorphous silicon TFT gate driver circuit (ASG) or an oxide silicon TFT gate driver (OSG).

It is, however, to be understood that the present disclosure is not limited thereto. The gate driver SGD may be formed of a plurality of driving chips, may be mounted on a flexible driving printed circuit board, and may be mounted on the first display substrate 100 by using tape carrier package (TCP) technique. The gate driver SGD may be formed of a plurality of driving chips and may be mounted on the first display substrate 100 by using chip-on-glass (COG) technique.

Figure 6:
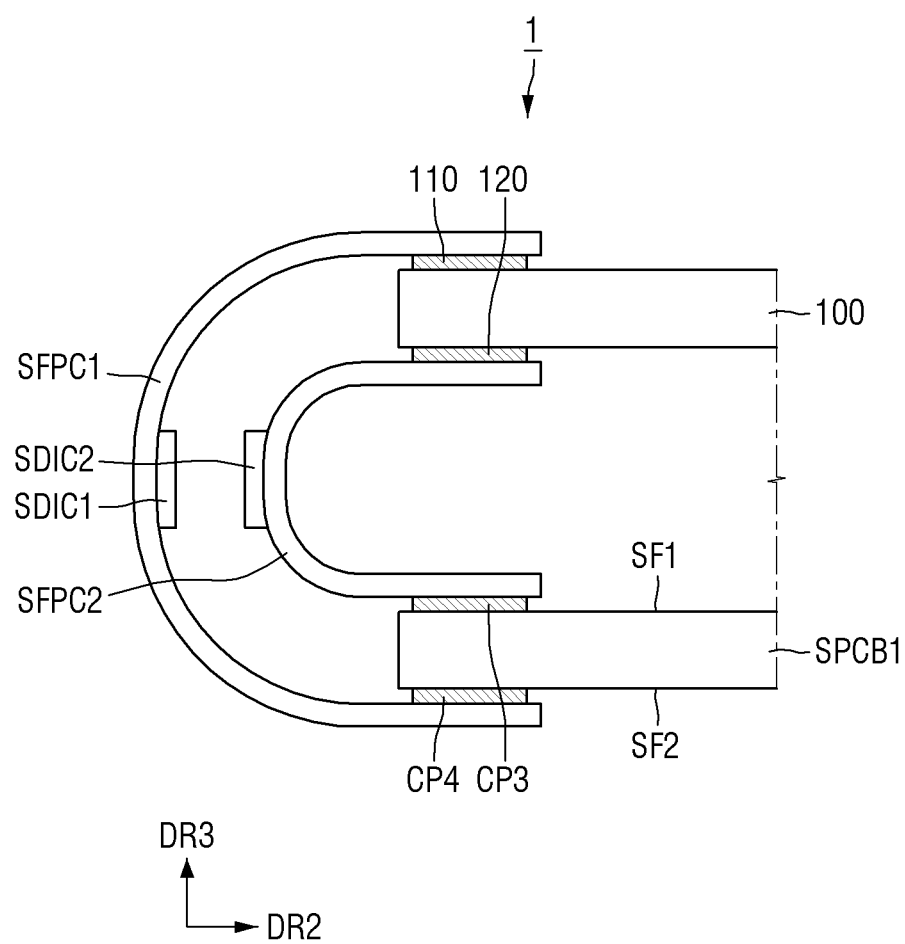
FIG. 6 is a view showing a display device according to some exemplary embodiments.

The data driver SDD may include a plurality of first source driver chips SDIC1 and a plurality of second source driver chips (e.g., SDIC2 of FIG. 6). The first source driver chips SDIC1 may be mounted on the first flexible printed circuit board SFPC1 and electrically connected to a predetermined location (for example, an upper surface) adjacent to a longer side of the first display substrate 100. In addition, the second source driver chips (e.g., SDIC2 of FIG. 6) may be mounted on the second flexible printed circuit board SFPC2 and electrically connected to a predetermined location (for example, a lower surface) adjacent to a longer side of the first display substrate 100. Detailed descriptions on this will be given later.

Although the first flexible printed circuit board SFPC1 and the second flexible printed circuit board SFPC2 are depicted as being connected adjacent to the longer side of the first display substrate 100 in the FIG. 1, exemplary embodiments of the present disclosure are not limited thereto. The locations at which the first flexible printed circuit board SFPC1 and the second flexible printed circuit board SFPC2 are connected to the first display substrate 100 may be modified as desired.

The first flexible printed circuit board SFPC1 may be electrically connected to the driving printed circuit board SPCB1, and the second flexible printed circuit board SFPC2 may be electrically connected to the driving printed circuit board SPCB1. Accordingly, the first source driver chips SDIC1 and the second source driver chips (e.g., SDIC2 of FIG. 6) may also be electrically connected to the driving printed circuit board SPCB1.

In some exemplary embodiments, each of the first flexible printed circuit board SFPC1 and the second flexible printed circuit board SFPC2 may be provided in the form of a flexible printed circuit board. Specifically, the first flexible printed circuit board SFPC1 and the second flexible printed circuit board SFPC2 may be implemented in the form of a chip-on-film (COF). Accordingly, the data driver SDD may be connected to the first display substrate 100 and the driving printed circuit board SPCB1 by using tape carrier package (TCP) technology.

The driving printed circuit board SPCB1 may include, for example, a timing controller (not shown). The timing controller may be mounted on the driving printed circuit board SPCB1 in the form of an integrated circuit chip and electrically connected to the gate driver SGD and the data driver SDD. The timing controller may output a gate control signal, a data control signal, and image data.

The gate driver SGD may receive the gate control signal from the timing controller. The gate driver SGD may generate gate signals in response to the gate control signal and sequentially output the generated gate signals. The gate signals may be applied to the pixels via gate lines SGL1 to SGLm row by row. As a result, the pixels SPX can be driven row by row.

The data driver SDD may receive image data and the data control signal from the timing controller. The data driver SDD may generate analog data voltages corresponding to the image data in response to the data control signal, to output them. The data voltages may be provided to the pixels SPX through the data lines SDL1 to SDLn.

The pixels SPX may receive data voltages through the data lines SDL1 to SDLn in response to the gate signals provided through the gate lines SGL1 to SGLm. The pixels SPX may display grayscale corresponding to the data voltages, thereby controlling the transmittance of the region in which each pixel SPX is disposed.

The second display substrate 300 may be disposed above the first display substrate 100. Specifically, the second display substrate 300 may be spaced apart from the first display substrate 100 in the third direction DR3. The liquid-crystal layer 200 may be interposed between the second display substrate 300 and the first display substrate 100. A common electrode for applying an electric field to the liquid-crystal layer 200 together with the pixel electrode of the first display substrate 100 may be disposed on the second display substrate 300. In addition, color filters for producing the colors corresponding to the pixels SPX described above may be disposed.

In some exemplary embodiments, the second display substrate 300 may expose a portion of the first display substrate 100. Specifically, the second display substrate 300 may expose a portion of a longer side of the first display substrate 100 to which the first flexible printed circuit board SFPC1 and the second flexible printed circuit board SFPC2 are connected. First connection wirings 115 (see FIG. 3) and first connection pads 110 (see FIG. 3) for electrical connection with the first flexible printed circuit board SFPC1 may be disposed on the upper surface of the first display substrate 100 exposed by the second display substrate 300. In addition, second connection pads 120 (see FIG. 3) for electrical connection with the second flexible printed circuit board SFPC2 may be disposed on the lower surface of the first display substrate 100. The second connection wirings 125 (see FIG. 3) may be extended from the upper surface to the lower surface of the first display substrate 100 along the side surface, and may be connected to the second connection pads 120 (see FIG. 3). Detailed descriptions on this will be given later.

Although not shown in the drawings, an optical sheet (not shown) including a polarizing sheet may be disposed between the backlight unit BLU and the first display substrate 100. Such an optical sheet may control the characteristics of light provided from the backlight unit BLU so that the transmittance of light passing through the display panel is effectively controlled. In addition, although not shown in the drawings, the display device 1 may further include a housing member (not shown) for accommodating the backlight unit BLU and the display panel.

Figure 2:
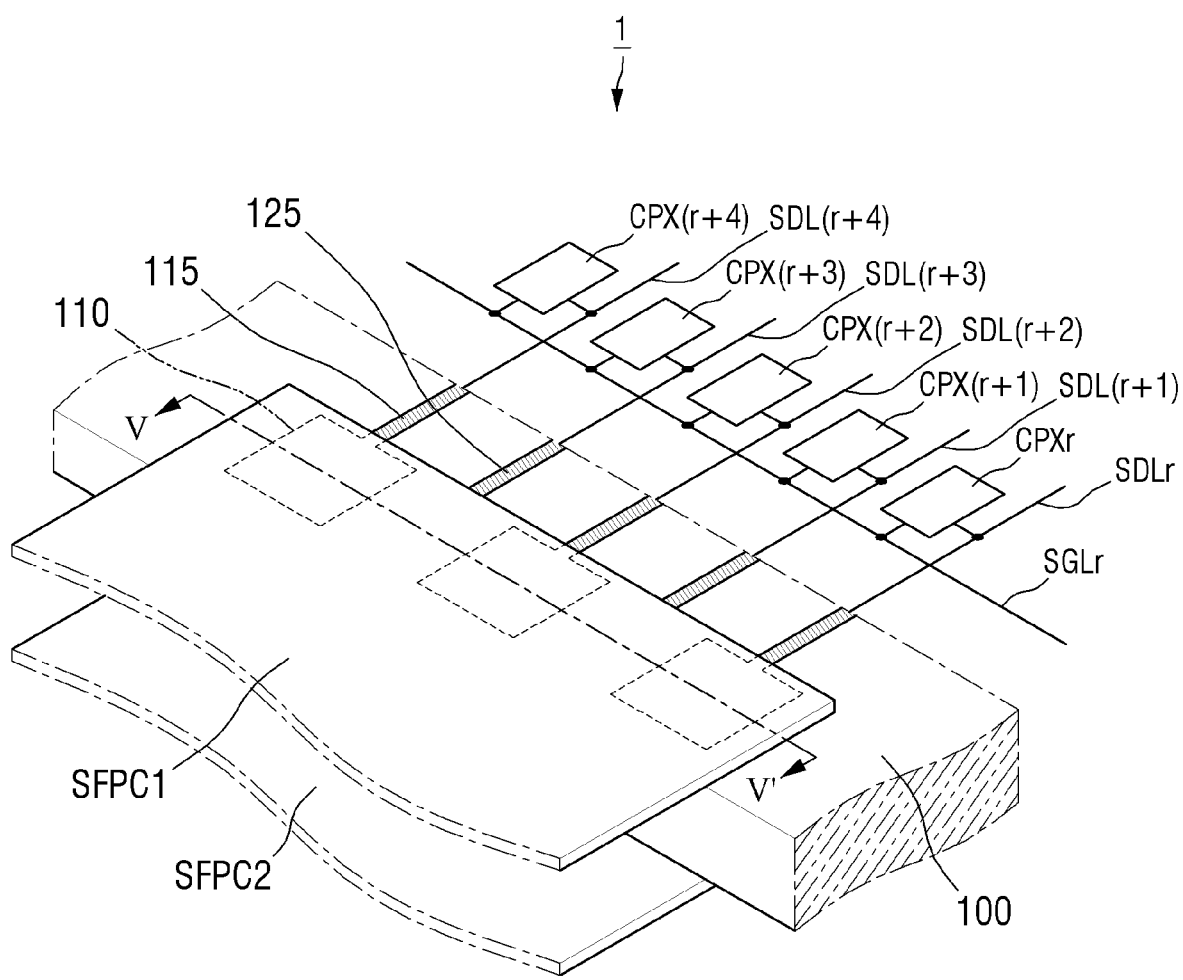
FIG. 2 is an enlarged, perspective view of area A shown in FIG. 1.
Figure 3:
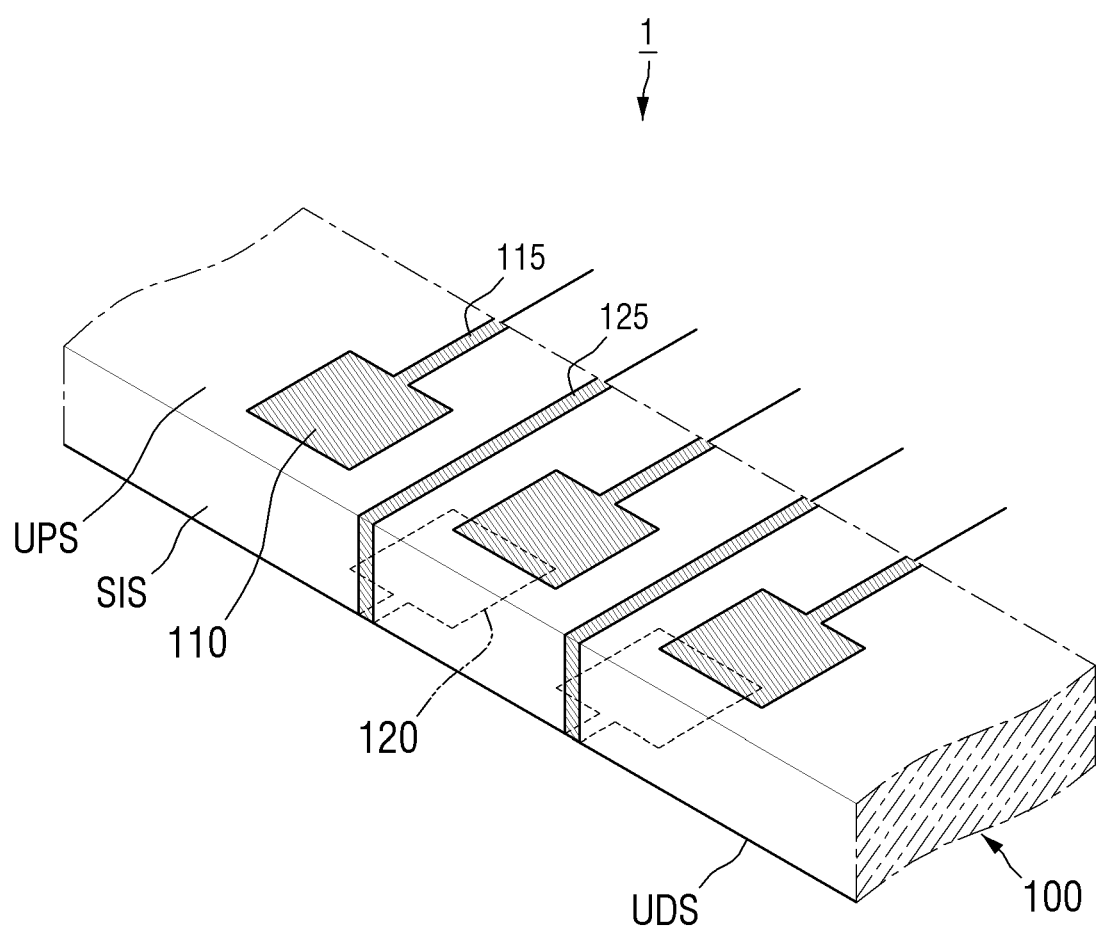
FIG. 3 is a view showing the first display substrate of FIG. 2.
Figure 4:
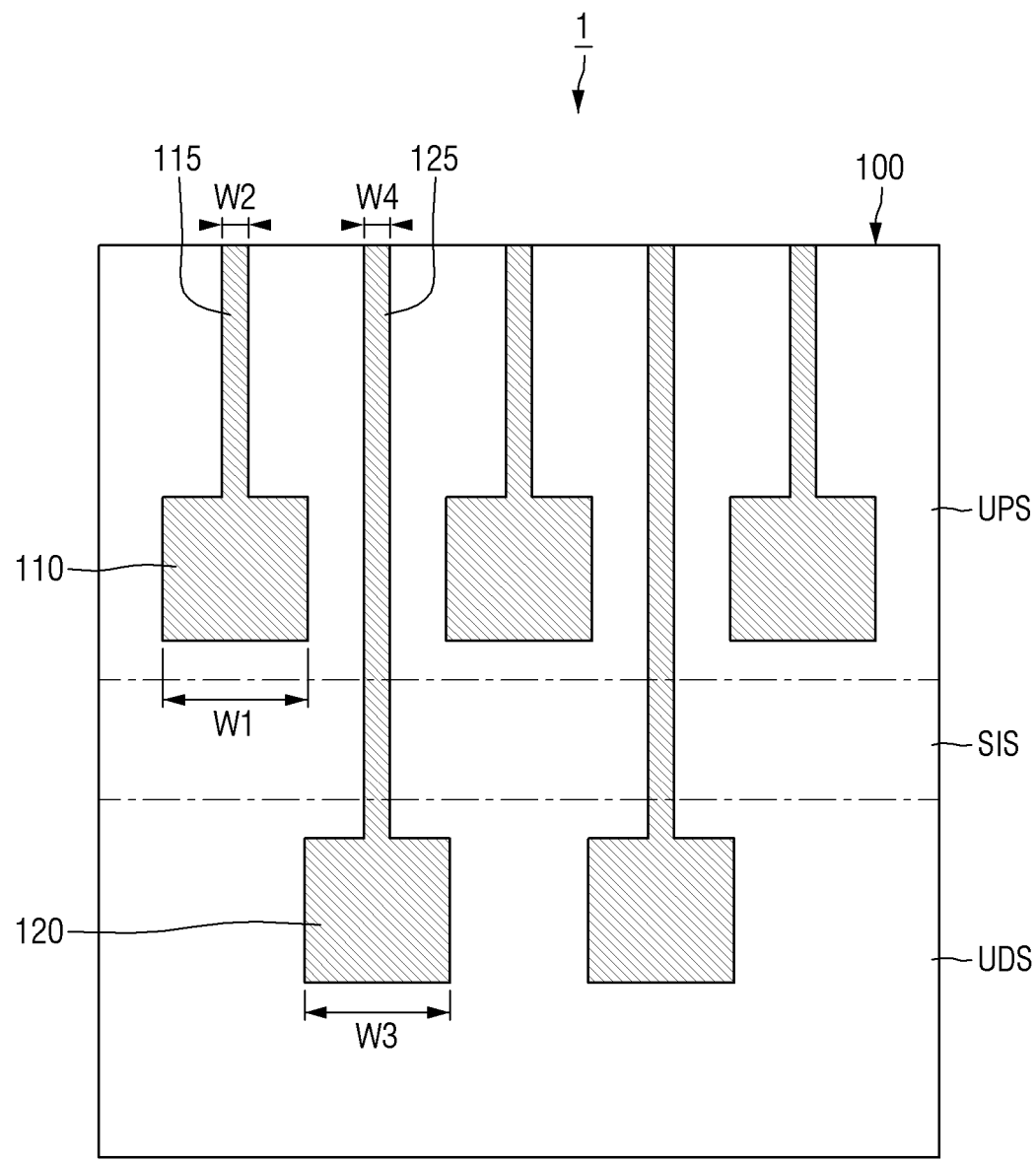
FIG. 4 is a development view of the first display substrate of FIG. 2.
Figure 5:
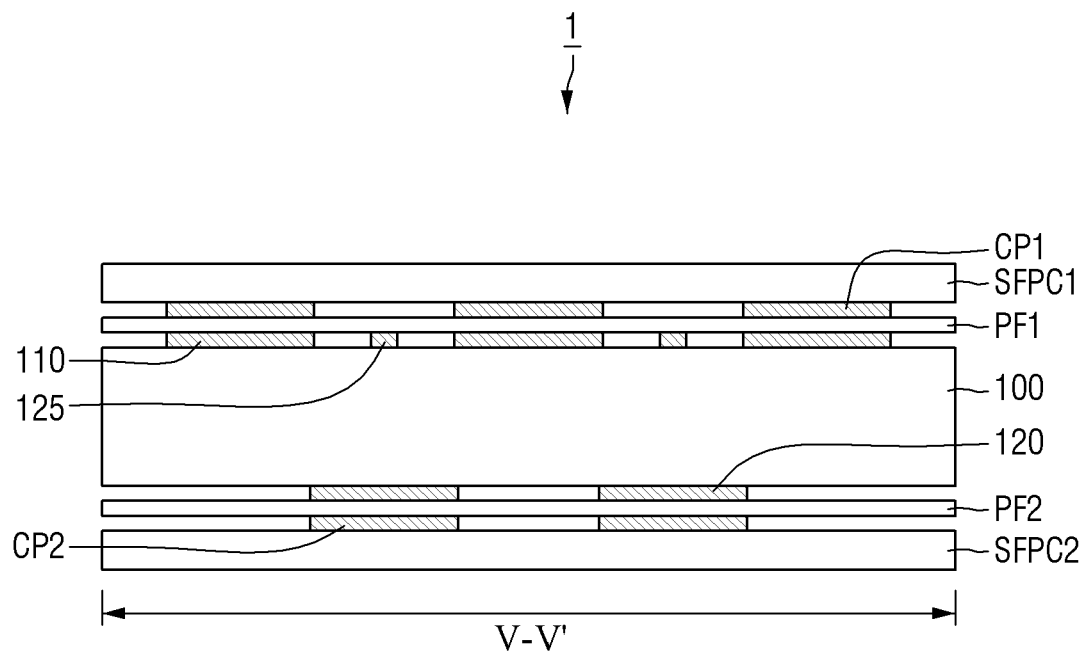
FIG. 5 is a cross-sectional view taken along line V-V' of FIG. 2.

FIG. 2 is an enlarged, perspective view of area A shown in FIG. 1. FIG. 3 is a view showing the first display substrate of FIG. 2. FIG. 4 is a development view of the first display substrate of FIG. 2. FIG. 5 is a cross-sectional view taken along line V-V' of FIG. 2. FIG. 6 is a view showing a display device according to some exemplary embodiments of the present disclosure with elements connected.

Referring to FIGS. 2 to 6, in the first display substrate 100, first connection wirings 115, first connection pads 110, second connection wirings 125 and second connection pads 120 may be disposed in regions where the first flexible printed circuit board SFPC1 and the second flexible printed circuit board SFPC2 are fixed.

The first connection pads 110 and the first connection wirings 115 may be disposed on the upper surface UPS of the first display substrate 100, as shown in the drawings. Specifically, the first connection wirings 115 may be electrically connected to some data lines SDLr, SDL(r+2) and SDL(r+4) among the plurality of data lines SDLr to SDL(r+4), where r is a natural number. The gate line SGLr is disposed such that it intersects the plurality of data lines SDLr to SDL(r+4), and the plurality of pixels CPXr to CPX(r+4) may be electrically connected to the gate line SGLr.

Although only three first connection wirings 115 and two second connection wirings 125 are shown in FIGS. 2 and 3, this is for the sake of easy understanding. In practice, the number of the first and second connection wirings 115 and 125 electrically connected to the plurality of data lines SDLr to SDL(r+4) may be less or more than three.

The data lines SDLr, SDL(r+2) and SDL(r+4) may be electrically connected to the pixels CPXr, CPX(r+2) and CPX(r+4). Accordingly, the first connection wirings 115 may be electrically connected to the pixels CPXr, CPX(r+2), and CPX(r+4).

The first connection pads 110 may be extended from the first connection wirings 115 may be disposed on the upper surface UPS of the first display substrate 100. Accordingly, the first connection pads 110 may be electrically connected to the pixels CPXr, CPX(r+2) and CPX(r+4) through the first connection wirings 115.

Although the first connection pads 110 are shown as being electrically connected to the pixels CPXr, CPX(r+2) and CPX(r+4) through the first connection wirings 115 in the drawings, the first connection wirings 115 may be eliminated as desired. Then, the first connection pads 110 may be electrically connected directly to the data lines SDLr, SDL(r+2) and SDL(r+4) without passing through the first connection wirings 115.

As illustrated in FIG. 4, the width W1 of the first connection pads 110 may be greater than the width W2 of the first connection wirings 115. As such, by enlarging the first connection pads 110, connection reliability with the first flexible printed circuit board SFPC1 can be improved.

The first connection pads 110 may be electrically connected to contact pads CP1 of the first flexible printed circuit board SFPC1. Specifically, referring to FIG. 5, the first connection pads 110 may be electrically connected to the contact pads CP1 of the first flexible printed circuit board SFPC1 by outer lead bonding (OLB) using a first adhesive film PF1.

In some exemplary embodiments, the first adhesive film PF1 may include an anisotropic conductive film (ACF). When the first adhesive film PF1 is an anisotropic conductive film, the first adhesive film PF1 may have conductivity only in a region where the first connection pads 110 and the contact pads CP1 of the first flexible printed circuit board SFPC1 are in contact with each other, thereby electrically connecting the first connection pads 110 with the contact pads CP1 of the first flexible printed circuit board SFPC1.

The first source driver chips SDIC1 mounted on the first flexible printed circuit board SFPC1, respectively, may generate data voltages for driving the pixels CPXr, CPX(r+2) and CPX(r+4) electrically connected thereto through the first connection pads 110. The data voltages thus generated may be transferred to the data lines SDLr, SDL(r+2) and SDL(r+4) through the first connection pads 110, respectively.

The second connection wirings 125 may be extended from the upper surface UPS to the side surface SIS of the first display substrate 100 as shown in the drawings. In some exemplary embodiments, the second connection wirings 125 may be extended from the upper surface UPS of the first display substrate 100 to the lower surface UDS of the first display substrate 100 along the side surface SIS.

Each of the second connection wirings 125 may pass between the first connection pads 110, as shown in the drawings. Specifically, on the upper surface UPS of the first display substrate 100, the second connection wirings 125 may be extended in parallel to the first connection wirings 115 and may be extended to the side surface SIS of the first display substrate 100 by passing between the first connection pads 110.

The width W4 of the second connection wirings 125 may be less than the width W1 of the first connection pads 110.

The second connection wirings 125 may be electrically connected to some data lines SDL(r+1) and SDL(r+3) among the data lines SDLr to SDL(r+4). The data lines SDL(r+1) and SDL(r+3) may be electrically connected to the pixels CPX(r+1) and CPX(r+3). Accordingly, the second connection wirings 125 may be electrically connected to the pixels CPX(r+1) and CPX(r+3).

The second connection pads 120 may be disposed on the lower surface UDS of the first display substrate 100. Specifically, the second connection pads 120 may be extended from the second connection wirings 125 and may be disposed on the lower surface UDS of the first display substrate 100. Accordingly, the second connection pads 120 may be electrically connected to the pixels CPX(r+1) and CPX(r+3) through the second connection wirings 125.

As illustrated in FIG. 4, the width W3 of the second connection pads 120 may be greater than the width W4 of the second connection wirings 125. As such, by enlarging the second connection pads 120, connection reliability with the second flexible printed circuit board SFPC2 can be improved.

The second connection pads 120 may be electrically connected to contact pads CP2 of the second flexible printed circuit board SFPC2. Specifically, referring to FIG. 5, the second connection pads 120 may be electrically connected to the contact pads CP2 of the second flexible printed circuit board SFPC2 by outer lead bonding (OLB) using a second adhesive film PF2.

In some exemplary embodiments, the second adhesive film PF2 may include an anisotropic conductive film (ACF). When the second adhesive film PF2 is an anisotropic conductive film, the second adhesive film PF2 may have conductivity only in regions where the second connection pads 120 and the contact pads CP2 of the first flexible printed circuit board SFPC2 are in contact with each other, thereby electrically connecting the second connection pads 120 with the contact pads CP2 of the first flexible printed circuit board SFPC2.

In some exemplary embodiments, the first flexible printed circuit board SFPC1 and the second flexible printed circuit board SFPC2 may be substantially the same flexible printed circuit board except their different orientations. In other words, the second flexible printed circuit board SFPC2 may be implemented by turning over the first flexible printed circuit board SFPC1.

The second source driver chips SDIC2 mounted on the second flexible printed circuit board SFPC2, respectively, may generate data voltages for driving the pixels CPX(r+1) and CPX(r+3) electrically connected thereto through the second connection pads 120. The data voltages thus generated may be transferred to the data lines SDL(r+1) and SDL(r+3) through the second connection pads 120.

The driving printed circuit board SPCB1 may be electrically connected to the first flexible printed circuit board SFPC1 and the second flexible printed circuit board SFPC2.

For example, as shown in FIG. 6, the driving printed circuit board SPCB1 may be accommodated below the first display substrate 100 as the first flexible printed circuit board SFPC1 and the second flexible printed circuit board SFPC2 are bent.

Then, contact pads CP3 disposed on the first surface SF1 of the driving printed circuit boards SPCB1 may be electrically connected to the second flexible printed circuit board SFPC2, and contact pads CP4 disposed on the second surface SF2 of the driving printed circuit boards SPCB1 may be connected to the first flexible printed circuit board SFPC1. In other words, the driving printed circuit board SPCB1 may be electrically connected to the first and second flexible printed circuit board SFPC1 and SFPC2 using the contact pads CP3 and CP4 disposed on opposite surfaces of the driving printed circuit board SPCB1.

As shown in FIG. 6, in the course of bending the first flexible printed circuit board SFPC1 and the second flexible printed circuit board SFPC2, the first source driver chip SDIC1 mounted on the first flexible printed circuit board SFPC1 may face the second source driver chip SDIC2 mounted on the second flexible printed circuit board SFPC2.

Although the first and second connection wirings 115 and 125 are electrically connected to the data lines SDLr to SDL(r+4) in the foregoing description, this is merely illustrative. In other implementations, the first and second connection wirings 115 and 125 and the first and second connection pads 110 and 120 may be arranged in similar shapes so that they may be electrically connected to the plurality of gate lines SGL1 to SGLm of FIG. 1 or the other wirings of the first display substrate 100.

Figure 7:
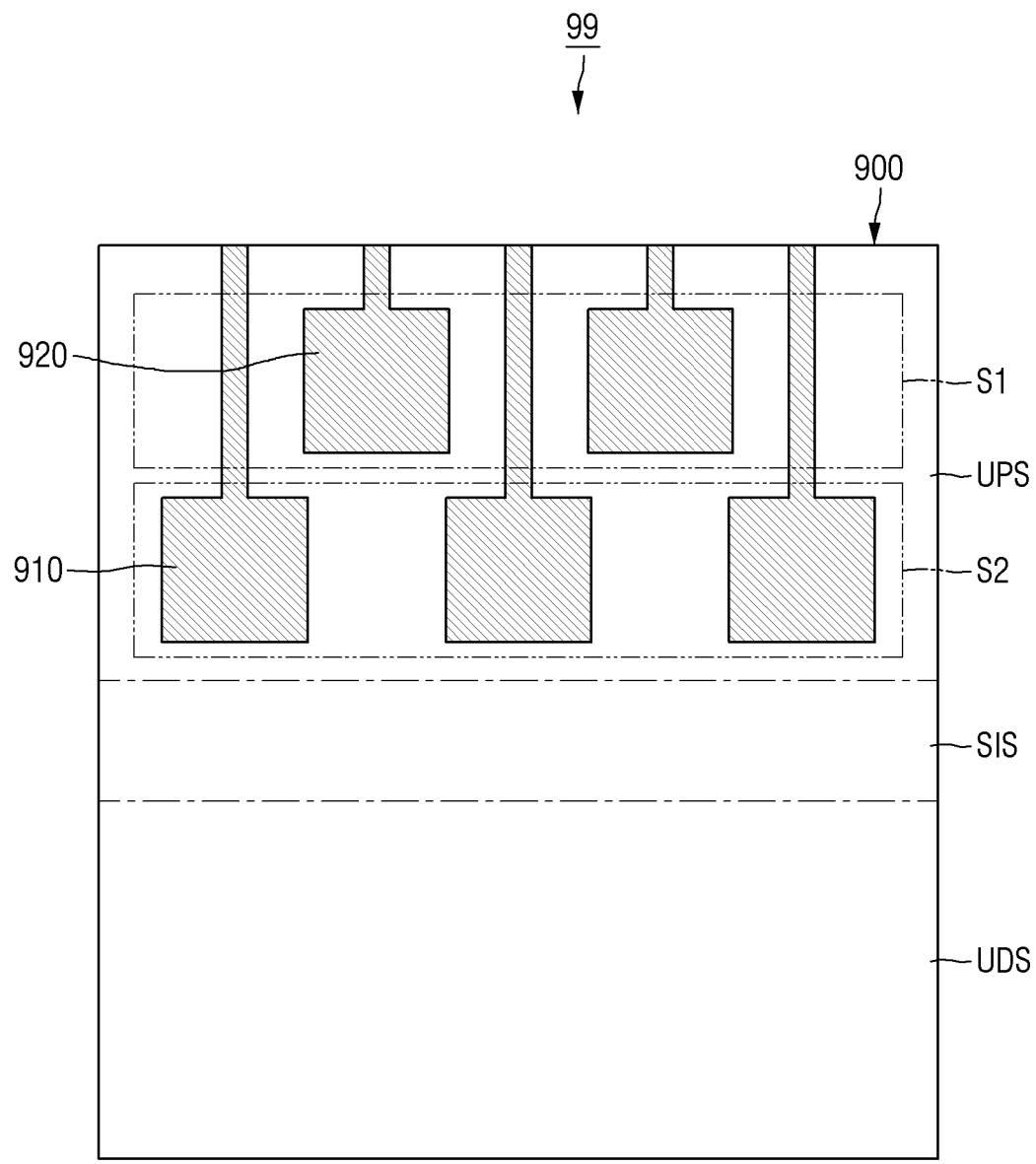
FIGS. 7 and 8 are views for illustrating effects achieved by the display device according to some exemplary embodiments.
Figure 8:
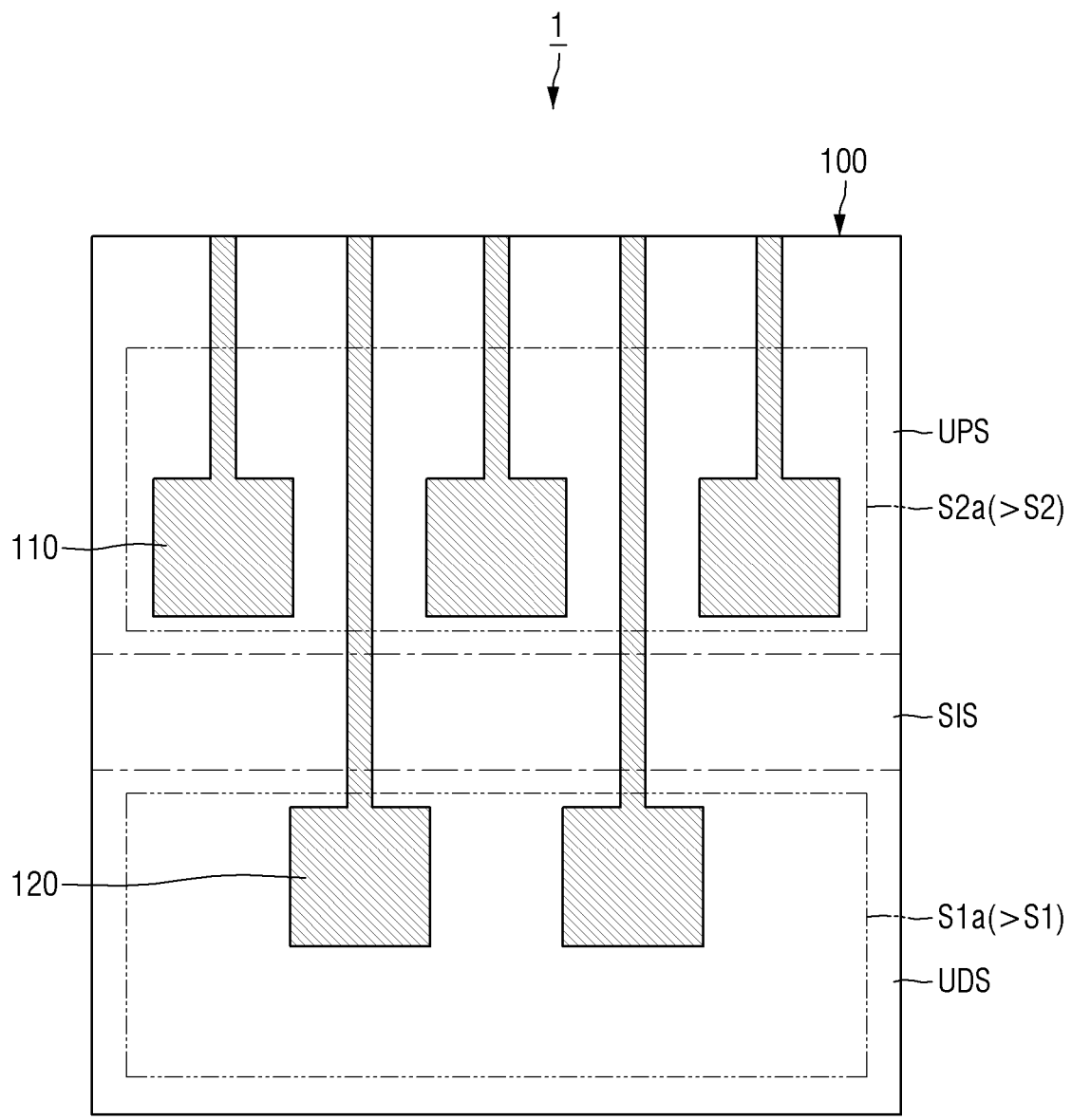

FIGS. 7 and 8 are views for illustrating effects achieved by the display device according to some exemplary embodiments of the present disclosure.

First, FIG. 7 shows a comparative display device 99 which is different from the above-described display device in the layout of connection wirings and connection pads.

Specifically, referring to FIG. 7, first connection pads 910 and second connection pads 920 of the display device 99 are all disposed on the upper surface UPS of a first display substrate 900. Accordingly, the space occupied by a first flexible printed circuit board (not shown) electrically connected to the first connection pads 910 is limited to a first area S2, and the space occupied by a second flexible printed circuit board (not shown) electrically connected to the second connection pads 920 is limited to a second area S1.

That is to say, the limited area of the upper surface UPS of the first display substrate 900 is shared by the first flexible printed circuit board (not shown) and the second flexible printed circuit board attached to the first display substrate 900. Accordingly, when the first flexible printed circuit board (not shown) is attached to the first connection pads 910 or the second flexible printed circuit board (not shown) is attached to the second connection pads 920, the flexible printed circuit boards may fail to be properly seated on the connection pads 910 and 920. If the flexible printed circuit boards are not properly seated on the connection pads 910 and 920, there may be an open-circuit in the wirings, such that driving signals to be transmitted from the source driving chip to the data lines may not be properly transmitted. That is to say, the operational reliability of the display device may be deteriorated. In this comparative embodiment, the areas of side surface SIS and the lower surface UDS of the first display substrate are not used for the electrical connections.

In contrast, referring to FIG. 8, in the display device 1 according to the inventive concepts, the first connection pads 110 are disposed on the upper surface UPS of the first display substrate 100 while the second connection pads 120 are disposed on the lower surface UDS of the first display substrate 100, thereby increasing the area that can be occupied by the flexible printed circuit boards (not shown).

Specifically, the space that can be occupied by the first flexible printed circuit board (not shown) electrically connected to the first connection pads 110 is increased up to a third area S2a which is greater than the first area S2 (see FIG. 7), and the space that can be occupied by the second flexible printed circuit board (not shown) electrically connected to the second connection pads 120 is increased up to a fourth area S1a which is greater than the second area S1 (see FIG. 7). As a result, in the process of attaching the flexible printed circuit boards (not shown) to the first display substrate 100, the risk of open-circuit of the wirings can be reduced, so that the operational reliability of the display device can be improved.

Figure 9:
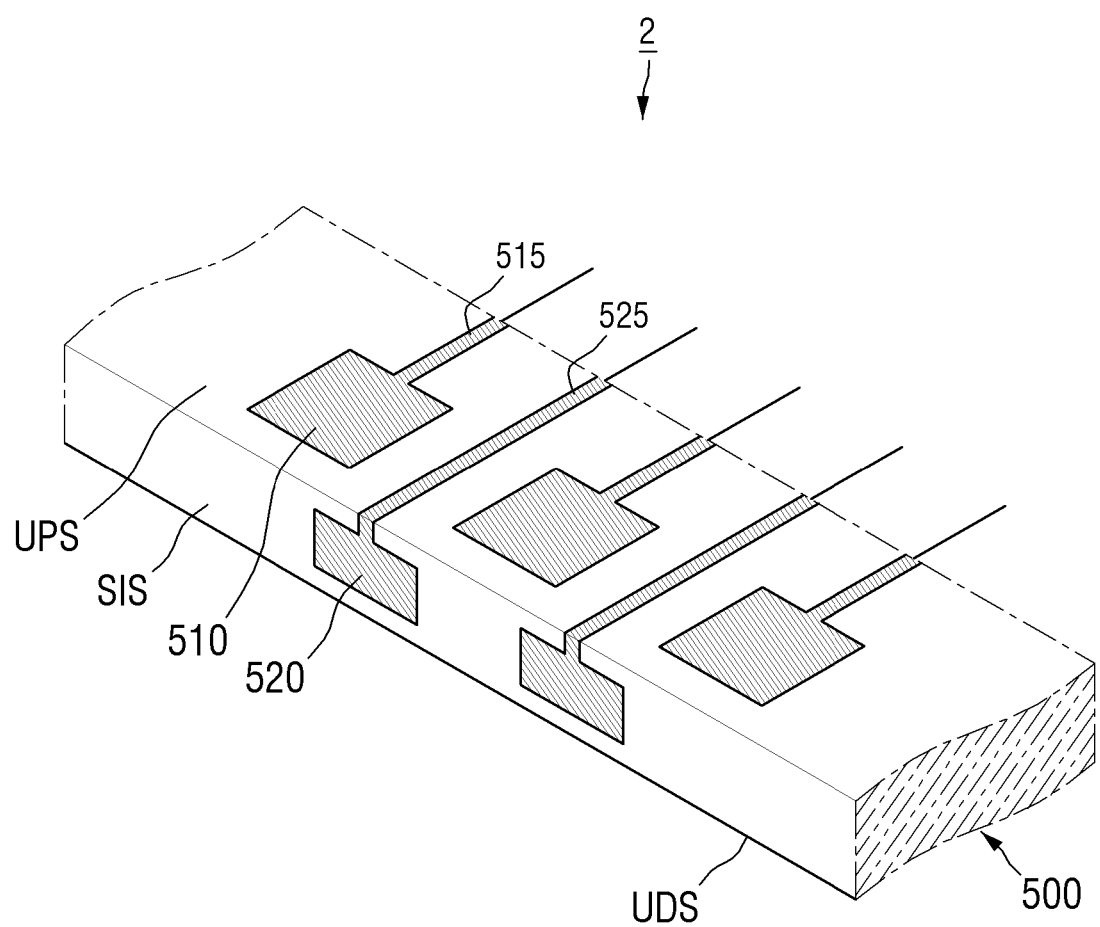
FIG. 9 is a view showing a first display substrate of a display device according to some exemplary embodiments.

FIG. 9 is a view showing a first display substrate of a display device according to another exemplary embodiment of the present disclosure. In the following descriptions, differences from the above exemplary embodiments will be described, and the redundant description will be omitted.

Referring to FIG. 9, second connection pads 520 of a display device 2 according to this exemplary embodiment may be disposed on a side surface SIS rather than a lower surface UDS of a first display substrate 500. Specifically, first connection pads 510 of the display device 2 may be extended from first connection wirings 515 and disposed on the upper surface UPS of the first display substrate 500, while the second connection pads 520 may be extended from the second connection wirings 525 and disposed on the side surface SIS of the first display substrate 500. The second connection wirings 525 may be extended from the upper surface UPS of the first display substrate 500 to the side surface SIS and may pass between the first connection pads 510 disposed on the upper surface UPS of the first display substrate 500.

As the arrangement of the second connection pads 520 is changed as described above, the flexible printed circuit boards may be electrically connected to the first and second connection pads 510 and 520 differently, and the driving printed circuit board may be electrically connected to the flexible printed circuit boards differently. Such differences will be described below with reference to FIGS. 10 and 11.

Figure 10:
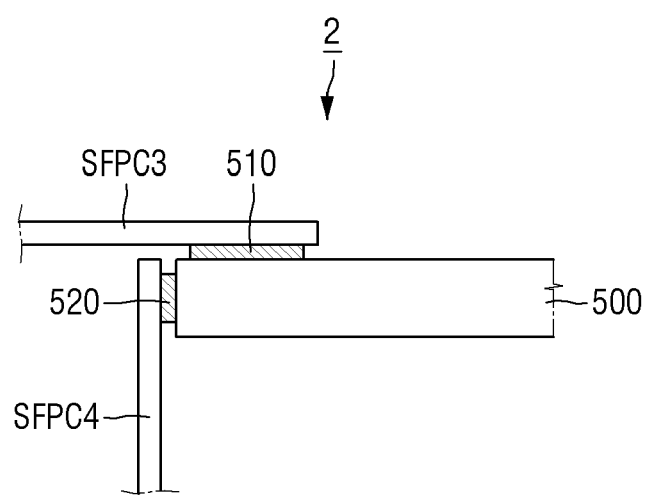
FIG. 10 is a view showing a way of coupling a first display substrate with flexible printed circuit boards of a display device according to some other exemplary embodiments.
Figure 11:
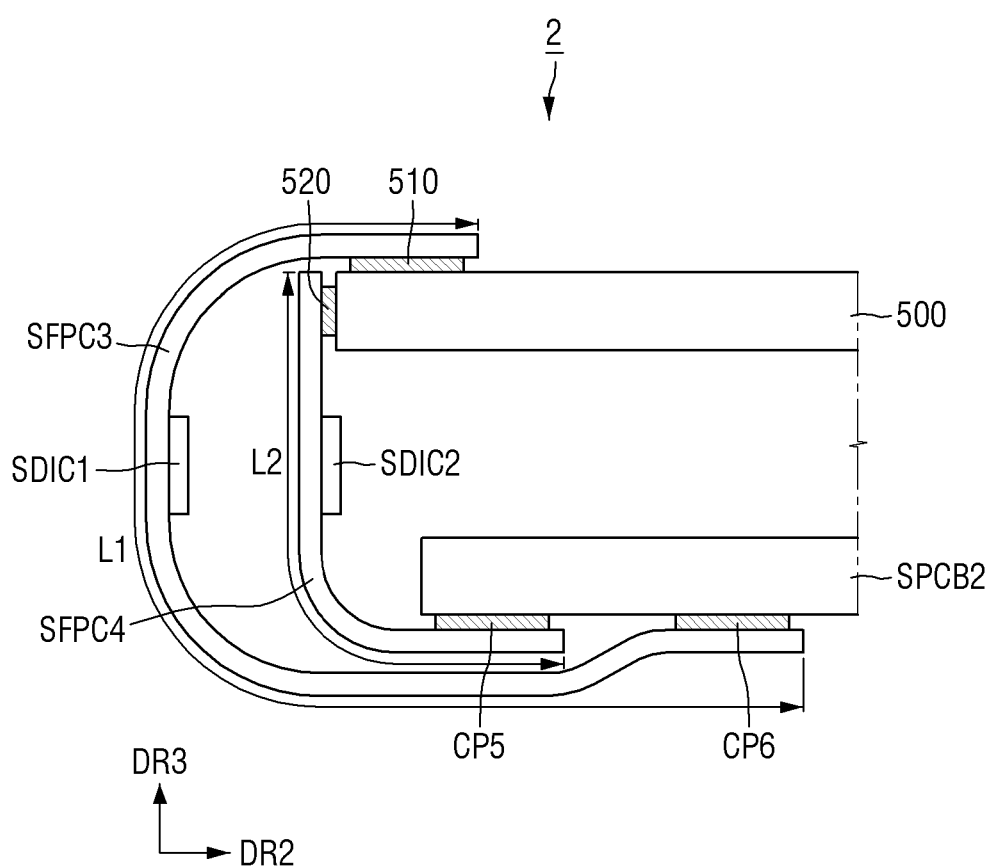
FIG. 11 is a view showing a display device according to some other exemplary embodiments.

FIG. 10 is a view showing a way of coupling a first display substrate with flexible printed circuit boards of a display device according to some other exemplary embodiments of the present disclosure. FIG. 11 is a view showing a display device according to some other exemplary embodiments of the present disclosure when it is assembled.

Referring to FIGS. 10 and 11, the first flexible printed circuit board SFPC3 may be extended in the second direction DR2 and may be electrically connected to the first connection pads 510, and the second flexible printed circuit board SFPC4 may be extended in the third direction DR3 and may be electrically connected to the second connection pads 520.

For example, as shown in FIG. 11, the driving printed circuit board SPCB2 may be accommodated below the first display substrate 500 as the first flexible printed circuit board SFPC3 and the second flexible printed circuit board SFPC4 are bent.

It is to be noted that contact pads CP5 and CP6 used for electrically connecting the driving printed circuit board SPCB2 with the first and second flexible printed circuit boards SFPC3 and SFPC4 may be disposed on the same surface of the driving printed circuit board SPCB2, unlike the above-described exemplary embodiment.

Then, a first contact pad CP5 disposed on the lower surface of the driving printed circuit boards SPCB2 may be electrically connected to the second flexible printed circuit boards SFPC4, and a second contact pad CP6 disposed on the lower surface of the driving printed circuit boards SPCB2 may be connected to the first flexible printed circuit boards SFPC3. In other words, the driving printed circuit board SPCB2 may be electrically connected to the first and second flexible printed circuit boards SFPC1 and SFPC2 using the contact pads CP5 and CP6 disposed on same surface of the driving printed circuit board SPCB2.

According to this exemplary embodiment, the first flexible printed circuit board SFPC3 and the second flexible printed circuit board SFPC4 may have different shapes. Specifically, the first flexible printed circuit board SFPC3 and the second flexible printed circuit board SFPC4 may be different kinds of flexible printed circuit boards having different lengths. More specifically, the length L1 of the first flexible printed circuit board SFPC3 electrically connecting the first connection pads 510 with the driving printed circuit board SPCB2 may be greater than the length L2 of the second flexible printed circuit board SFPC4 electrically connecting the second connection pads 520 with the driving printed circuit board SPCB2.

Additionally, as shown in FIG. 11, in the course of bending the first flexible printed circuit board SFPC3 and the second flexible printed circuit board SFPC4, the first source driver chip SDIC1 mounted on the first flexible printed circuit board SFPC3 may not face the second source driver chip SDIC2 mounted on the second flexible printed circuit board SFPC4 but may face in the same direction.

Some of the advantages that may be achieved by exemplary implementations and embodiments of the invention include allowing the area of a surface of a display substrate that can be occupied by a flexible printed circuit board attached thereto to be increased. As a result, the risk of an open-circuit of the wiring can be reduced, and the operational reliability of the device can be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display substrate comprising a plurality of pixels electrically connected to select lines and data lines;
first connection pads disposed on an upper surface of the display substrate and electrically connected to the pixels;
second connection pads disposed on a surface of the display substrate that is different from the upper surface and electrically connected to the pixels, wherein the second connection pads are electrically separated from the first connection pads; and
connection wirings disposed on the upper surface of the display substrate and electrically connected to the second connection pads, wherein the first connection pads comprise a third connection pad and a fourth connection pad, and each of the connection wirings passes between the third and fourth connection pads.

2. The display device of claim 1, wherein a width of the connection wirings is less than a width of the third and fourth connection pads.

3. The display device of claim 1, wherein the connection wirings extend from the upper surface of the display substrate to a side surface of the display substrate.

4. A display device, comprising:
a display substrate comprising a plurality of pixels electrically connected to select lines and data lines;
first connection pads disposed on an upper surface of the display substrate and electrically connected to the pixels; and
second connection pads disposed on a surface of the display substrate that is different from the upper surface and electrically connected to the pixels, wherein the second connection pads are disposed on a lower surface of the display substrate and are electrically separated from the first connection pads; and
connection wirings extending from the upper surface of the display substrate to a side surface and a lower surface thereof, wherein the connection wirings are electrically connected to the second connection pads.

5. The display device of claim 4, wherein a width of the connection wirings is less than a width of the first connection pads.

6. A display device, comprising:
a display substrate comprising a plurality of pixels electrically connected to select lines and data lines;
first connection pads disposed on an upper surface of the display substrate and electrically connected to the pixels;
second connection pads disposed on a surface of the display substrate that is different from the upper surface and electrically connected to the pixels, wherein the second connection pads are electrically separated from the first connection pads;
a first flexible printed circuit board electrically connected to the first connection pads; and
a second flexible printed circuit board electrically connected to the second connection pads, wherein the second flexible printed circuit board is different from the first flexible printed circuit board.

7. The display device of claim 6, wherein the second connection pads are disposed on a side surface of the display substrate.

8. The display device of claim 7, further comprising: connection wirings extending from the upper surface of the display substrate to the side surface thereof, wherein the connection wirings are electrically connected to the second connection pads.

9. The display device of claim 8, wherein a width of the connection wirings is less than a width of the first connection pads.

10. The display device of claim 6, further comprising: a driving printed circuit board electrically connected to the first and second flexible printed circuit boards, wherein the first flexible printed circuit board is electrically connected to a first surface of the driving printed circuit board, and the second flexible printed circuit board is electrically connected to a second surface of the driving printed circuit board, wherein the second surface is opposite to the first surface.

11. The display device of claim 6, wherein a length of the first flexible printed circuit board is different from a length of the second flexible printed circuit board.

12. A display device, comprising:
a display substrate comprising: a plurality of pixels electrically connected to select lines and data lines, wherein first connection pads receiving a first signal for driving a first portion of the pixels are disposed on a upper surface of the display substrate, and second connection pads receiving a second signal for driving a second portion of the pixels disposed on a surface of the display substrate different from the upper surface;
a first flexible printed circuit board electrically connected to the first connection pads; and
a second flexible printed circuit board electrically connected to the second connection pads, wherein the second flexible printed circuit board is different from the first flexible printed circuit board.

13. The display device of claim 12, wherein the second connection pads are disposed on a lower surface of the display substrate.

14. The display device of claim 13, further comprising: a driving printed circuit board electrically connected to the first and second flexible printed circuit boards, wherein the driving printed circuit board comprises a first contact pad disposed on a first surface thereof and electrically connected to the first connection pads; and a second contact pad disposed on a second surface thereof opposite to the first surface and electrically connected to the second connection pads.

15. The display device of claim 13, wherein the first flexible printed circuit board comprises a first source driver chip, the second flexible printed circuit board comprises a second source driver chip, and the first source driver chip and the second source driver chip are disposed to face each other.

16. The display device of claim 12, wherein the second connection pads are disposed on a side surface of the display substrate.

17. The display device of claim 16, wherein a length of the first flexible circuit board is different from a length of the second flexible circuit board.

18. The display device of claim 17, wherein a length of the first flexible printed circuit board is different from a length of the second flexible printed circuit board.

\* \* \* \* \*